United States Patent
Ohshima

(10) Patent No.: US 7,791,853 B2
(45) Date of Patent: Sep. 7, 2010

(54) CONTROL APPARATUS OF SEMICONDUCTOR SWITCH

(75) Inventor: Shunzou Ohshima, Toyota (JP)

(73) Assignee: Yazaki Corporation, Tokyo (JP)

( * ) Notice: Subject to any disclaimer, the term of this patent is extended or adjusted under 35 U.S.C. 154(b) by 360 days.

(21) Appl. No.: 11/153,334

(22) Filed: Jun. 16, 2005

(65) Prior Publication Data

US 2005/0286200 A1  Dec. 29, 2005

(30) Foreign Application Priority Data

Jun. 16, 2004  (JP)  ............................ P2004-178801

(51) Int. Cl.
    *H02H 3/08*  (2006.01)
(52) U.S. Cl. ..................................... 361/93.1
(58) Field of Classification Search ................ 361/93.1, 361/88, 91.2, 91.4, 93.2, 93.9, 86, 87, 76
    See application file for complete search history.

(56) References Cited

U.S. PATENT DOCUMENTS

| | | | | |
|---|---|---|---|---|
| 3,916,262 | A | * | 10/1975 | Easter ........................ 361/91.1 |
| 5,229,707 | A | * | 7/1993 | Szepesi et al. ............... 323/222 |
| 5,351,162 | A | * | 9/1994 | Koishikawa .................. 361/18 |
| 6,011,416 | A | * | 1/2000 | Mizuno et al. .............. 327/108 |
| 6,222,355 | B1 | * | 4/2001 | Ohshima et al. ............. 323/282 |
| 6,222,709 | B1 | * | 4/2001 | Baba ........................... 361/18 |
| 2003/0142449 | A1 | * | 7/2003 | Iwata et al. ................... 361/58 |

FOREIGN PATENT DOCUMENTS

| | | | |
|---|---|---|---|
| JP | 1-186113 | A | 7/1989 |
| JP | 4-106769 | U | 9/1992 |
| JP | 05-292788 | * | 11/1993 |
| JP | 07-170758 | A | 7/1995 |
| JP | 08-168236 | A | 6/1996 |
| JP | 11-159378 | * | 6/1999 |
| JP | 2000-253560 | A | 9/2000 |
| JP | 2001-286180 | A | 10/2001 |
| JP | 2002-353794 | A | 12/2002 |
| JP | 2004-48498 | A | 2/2004 |
| JP | 2005-341635 | A | 12/2005 |
| WO | 02/097940 | A2 | 12/2002 |
| WO | 2004/008500 | A2 | 1/2004 |

OTHER PUBLICATIONS

English translation of Kozo et al., JP 11-159378, Jun. 1999.*
Japanese Office Action dated Nov. 18, 2008.

* cited by examiner

*Primary Examiner*—Jared J Fureman
*Assistant Examiner*—Nicholas Ieva
(74) *Attorney, Agent, or Firm*—Sughrue Mion, PLLC

(57) ABSTRACT

A control apparatus includes a semiconductor switch that is arranged between a DC power supply and a load to control a turning ON/OFF operation of the load, a counter electromotive force judging unit that determines whether a counter electromotive force produced on a first wiring line is greater than a threshold voltage, the first wiring line connecting the semiconductor switch to the DC power supply, and a control unit that controls the semiconductor switch so as to be turned OFF when the counter electromotive force judging unit determines that the counter electromotive force is greater than the threshold voltage.

10 Claims, 8 Drawing Sheets

CONTROL APPARATUS OF SEMICONDUCTOR SWITCH

BACKGROUND OF THE INVENTION

The present invention is related to a control apparatus of a semiconductor switch provided between a DC power supply and a load, for turning ON/OFF the load. More specifically, the present invention is directed to a technique capable of protecting the semiconductor switch when a shortcircuit current is produced.

Loads (electric appliances) such as, for instance, a motor for driving a power window, or a lamp, which are mounted on a vehicle are driven by applying a DC voltage from a battery functioning as a DC power supply to the loads. In this case, since a semiconductor switch such as a MOSFET and the like, which is provided between a load and the battery, is turned ON/OFF so that this load is controlled so as to be driven/stopped.

Also, in a case that an overcurrent protecting apparatus is mounted, an overcurrent protecting apparatus immediately turns OFF the semiconductor switch for protecting both a circuit and a load when the overcurrent flows through the load. Such an overcurrent protecting apparatus is known from, for example, JP-A-2000-253560.

FIG. 8 is a circuit diagram for indicating an arrangement of the overcurrent protecting apparatus described in JP-A-2000-253560. As shown in FIG. 8, the overcurrent protecting apparatus has two sets of an N type MOSFET TA and an N type MOSFET TB as a semiconductor switch, which constitute a multi-source FET. Drains of the respective MOSFETs TA and TB are connected toga plus terminal of, a DC power supply VB.

Also, a source of the MOSFET TA is connected via a load (RL) to a minus terminal (ground) of the DC power supply VB. On the other hand, a source of the MOSFET (TB) is grounded via a resistor Rr. A transition component resistor R10 is arranged parallel to the resistor Rr in order to properly accept a rush current. This rush current is produced during transition condition when a lamp is loaded.

Also, the overcurrent protecting apparatus has a comparator CMP10, and a latch DF100 provided on the side of an output of this comparator CMP10. The comparator CMP10 compares a source voltage VSA of the MOSFET TA with a source voltage VSB of the MOSFET TB in voltage levels. An output terminal of the latch DF100 is connected to one of input terminals of an AND circuit AND100.

Further, the overcurrent protecting apparatus has a switch SW100 and a resistor R102, which are employed so as to turn ON/OFF the MOSFETs TA and TB. One terminal side of the switch SW100 is connected to a power supply VB, and the other terminal side of the switch SW100, namely a junction point between the other terminal of the switch SW100 and the resistor R102 is connected to the other input terminal of the AND circuit AND100.

The output terminal of the AND circuit AND100 is connected to a driver circuit 100, and an output terminal of this driver circuit 100 is connected via a resistor R100 to a gate of the MOSFET TA and a gate of the MOSFET TB.

The transition component resistor R10 is connected to the circuit of the overcurrent protecting apparatus for a time period during which a rush current flows through a load RL, namely only for a predetermined time duration from a time instant when the switch SW100 was turned ON, and thereafter, is cut out from the circuit. The latch DF100 is reset when the switch SW100 is turned OFF, and an output signal of this latch DF100 becomes an H level.

Next, operations of the overcurrent protecting apparatus will now be explained. Since the two input signals of the AND circuit AND100 become H levels when the switch SW100 is turned ON, the output signal of the AND circuit AND 100 becomes an H level, and the driver circuit 100 supplies a charge pump voltage to the gate "G" (namely common gates of respective MOSFETs TA and TB) of the multi-source FET.

As a result, the respective MOSFETs TA and TB are brought into ON states, a load current "ID" flows through the MOSFET TA, and at the same time, a reference current "Iref" flows through the MOSFET TB.

In this case, the MOSFET TB is set to have the same characteristic as that of the MOSFET TA, and normally, a channel width of the MOSFET TB is set to $1/1000$ to $1/2000$ of a channel width of the MOSFET TA. As a consequence, assuming that (channel width of TA)/(channel width of TB)=n, "n" is nearly equal to 1000 to 2000. Then, assuming that the source voltages of the MOSFETs TA and TB are "VSA" and "VSB", when VSA=VSB, the load current ID is defined as ID=n*Iref.

The magnitude of the voltage VSA depends upon the resistance of the load resistor RL, whereas the magnitude of the voltage VSB depends upon either a resistor Rr, or a combined parallel resistance between the resistor Rr and the transition component resistor R10. Under such a condition that both the wiring line and the load are set to the normal conditions, both the resistor Rr and the transition component resistor R10 are set in such a manner that VSA>VSB while the rush current flowing time period is included. As a result, the output signal of the comparator CMP10 is held at an L level under normal condition.

At this time, when the wiring line connected between the MOSFET TA and the load RL is shortcircuit/grounded due to some reasons, the load current ID is rapidly increased, and thus, the source voltage VSA of the MOSFET TA becomes smaller than the source voltage VSB of the MOSFET TB, so that the output signal (L level) of the comparator CMP10 is changed into H level, and also, the output signal (H level) of the latch DF100 is switched to an L level. As a result, the output signal of the AND circuit AND100 becomes an L level, the output terminal side of the driver circuit 100 is grounded, and also, the gate G of the multi-source FET is grounded via the resistor R100, so that the MOSFETs TA and TB are turned OFF. As a consequence, the shortcircuit current flowing through the MOSFET TA is cut out, so that both the wiring line and the MOSFET TA can be protected.

FIG. 9 is a characteristic diagram for representing a change of the current ID in such a case that when a rush current does not flow, namely the load RL is set under the normal condition, the wiring line between the MOSFET TA and the load RL is shortcircuited to be grounded.

As shown in FIG. 9, when the load current ID under the normal condition flows through the circuit of the overcurrent detecting apparatus, if a shortcircuit/grounding event happens to occur at a time instant constituting a point A1, the current ID rapidly starts to be increased. Assuming that a resistance of the wiring line through which the current ID flows is equal to "Rw", an inductance of this wiring line is "Lw", a drain-to-source resistance of the MOSFET TA is "RonA", the power supply voltage is "VB", and an internal resistance of the power supply is "Rbatt", the current ID flowing when the shortcircuit happens to occur is increased based upon an exponential function curve of a time constant "τ1" which is expressed by the below-mentioned equation (2), while a current value "ID1" indicated by the below-mentioned equation (1) is defined as a target value.

$$ID1 = VB/(RonA+Rw+Rbatt) \quad (1)$$

$$\tau 1 = Lw/(RonA+Rw+Rbatt) \quad (2)$$

Then, when the present time exceeds such a time instant constituting a point A2, the current ID becomes ID≧n*Iref, so that the multi-source FET is cut off. In this case, the gate G of the multi-source FET is grounded via the resistor R100, so that electric charges are discharged which is stored in the gate G. In this case, if a gate capacitance of this gate G is assumed as "Cg", then a discharge time constant becomes Cg*R100.

Since the gate-to-source voltage VGSA of the MOSFET TA is reached to approximately 10 V before being cut off, a finite time is required until the discharging operation of the gate electrons are accomplished. When the gate-to-source voltage VGSA is lowered due to the gate discharge operation, the drain-to-source resistance RonA of the MOSFET TA is increased.

In other words, although the resistance RonA is constant until the time instant of the point A2, this resistance RonA is increased when the time instant A2 elapses, so that the current ID1 shown in the above-described equation (1) becomes small, and the same time, the time constant "τ1" is also decreased. As a result, the current ID is increased in a linear manner which is deviated from the expositonal function, and then, is reached to a peak current at a time instant constituting a point A3. The faster the gate electrons of the multi-source FET are discharged, namely, the smaller the resistor R100 is decreased, the faster the time instant is reached to the point A3, so that the peak value of the current ID becomes low. Since the increase of the resistor RonA is continued, when the time instant of the point A3 has elapsed, the current ID is decreased and becomes zero at a time instant constituting a point A4.

FIG. 10 is a characteristic diagram for representing a change of the current ID in such a case that a shortcircuit/grounding event (failure) happens to occur during a transition period just after the switch SW100 is turned ON, namely while the transition component resistor R10 is being connected parallel to the resistor Rr. In this drawing, a curved line indicated by a two-dot and dash line represents a change of the current ID under such a normal condition that a shortcircuit/grounding event does not occur. In this drawing, the current ID corresponds to a so-called "rush current", and this rush current may be reached to such a peak current value which becomes larger than the current ID under normal condition by 5 to 10 times.

Then, in order to avoid such an erroneous judgement that this rush current is recognized as a shortcircuit current, a shortcircuit current judging value (n*Iref) is set to such a value which is larger than the peak value of the rush current. In other words, in FIG. 10, a dashed line for indicating (n*Iref) is set to become larger than the peak value of the rush current indicated by the two-dot dash line. In this case, in order to set the reference current Iref to a large value, the transition component resistor R10 is additionally connected parallel to the resistor Rr for a predetermined time (namely, rush current flowing time period).

When a shortcircuit/grounding event happens to occur at a point B1 of FIG. 10, the current ID is rapidly increased, the multi-source FET is cut off at a point B2, and the current ID is increased up to a point B3, and thereafter, the current ID is decreased. The operations are resembled to the above-described operation case of FIG. 9. The point B1 to B4 of FIG. 10 correspond to the points A1 to A4 of FIG. 9.

A different point between FIG. 9 and FIG. 10 is the magnitude of the current Iref. In FIG. 10, since the shortcircuit current judging value (n*Iref) is set to such a value which exceeds the rush current, when the multi-source FET is cut off, namely the current ID at the point B2 is increased, the peak value (point B3) of the shortcircuit current is increased. Until the point B2 where the MOSFET TA is turned ON, the source-to-drain voltage becomes a small value, so that even when a large current flows, a power loss of this MOSFET TA is small.

Then, when the present time passes through the point B2, the MOSFET TA is turned OFF, so that the source-to-drain voltage thereof is increased. If a large current flows under this condition, then a power loss of the MOSFET TA is increased. In FIG. 9, since the peak value of the shortcircuit current at the point A3 is small, the power loss is relatively small. In the case of FIG. 10, since the current ID is increased after the present time has passed through the point B2, the power loss of the MOSFET TA becomes large value, which may cause a temperature of the channel of this MOSFET TA to be increased. Since a time period from the point B1 to the point B4 during which the shortcircuit current flows corresponds to such a short time period shorter than, or equal to 300[μsec], the increase in the channel temperature of the MOSFET TA may be restricted by a transition thermal resistance.

Since the transition thermal resistance of this time range is determined by a chip size, an element having a large chip size must be used in order to suppress an increase of a channel temperature caused by a shortcircuit current. In other words, such an element having a small chip size cannot be used, so that a design freedom is restricted, which may cause a cost-up factor.

Also, there is another problem in fluctuations of the reference current Iref. That is, in order to avoid that the MOSFET TA is erroneously cut off by the rush current, the following measures must be taken, namely, the precision of the rush current judging value is increased, or an interval between the peak value of the rush current and the judging value is sufficiently widened. Any of these solving methods may cause the cost-up factor. As another solving method, one method has been proposed in which an overheat interrupting function capable of detecting an overheat condition of a semiconductor element to interrupt a current is additionally provided so as to protect an FET. Similarly, this solving method may cause the cost-up factor.

As previously explained, in the related overcurrent protecting apparatus, the discrimination of the shortcircuit current under the normal condition from the shortcircuit current under the abnormal condition is carried out by detecting the difference in the levels of the currents which flow through the MOSFET. As a result, when the peak value of the rush current is increased, the time required to be reached to the judging value is prolonged, so that the judgement as to the occurrence of the shortcircuit is delayed, and therefore, the timing when the shortcircuit current is cut off is delayed. As a consequence, the power loss of the semiconductor element is increased, so that such a problem may occur. That is, the temperature increase of the semiconductor element is enlarged.

SUMMARY OF THE INVENTION

The present invention has been made to solve the above-described problems of the related art, and therefore, has an object to provide a control apparatus of a semiconductor switch, capable of increasing discrimination precision between a shortcircuit current and a rush current, and at the same time, capable of shortening a judging time for detecting an occurrence of a shortcircuit current as short as possible. Thus, this control apparatus can quickly cut off a circuit when the shortcircuit current is produced, and thus, can minimize a power loss and a temperature increase of a semiconductor element.

In order to achieve the above object, according to the present invention, there is provided a control apparatus of a semiconductor switch, comprising:

a semiconductor switch that is arranged between a DC power supply and a load to control a turning ON/OFF operation of the load;

a counter electromotive force judging unit that determines whether a counter electromotive force produced on a first wiring line that connects the semiconductor switch to the DC power supply is greater than a threshold voltage; and a control unit that controls the semiconductor switch so as to be turned OFF when the counter electromotive force judging unit determines that the counter electromotive force is greater than the threshold voltage.

Preferably, the threshold voltage is set to a voltage value that is higher than counter electromotive force produced on the first wiring line by a transition current flowing through the load.

Preferably, the counter electromotive force judging unit includes a resistor for producing a reference voltage and a capacitor for producing the reference voltage. One terminal of the resistor is connected to a junction point between the semiconductor switch and the first wiring line. The capacitor is connected to the other terminal of the resistor. A voltage at a junction point between the resistor and the capacitor is employed as the reference voltage. The counter electromotive force judging unit produces the threshold voltage based on the reference voltage.

Preferably, a circuit configured by the resistor and the capacitor is set so that a time constant of the circuit during charging operation is identical to a time constant of the circuit during discharging operation.

Preferably, the counter electromotive force produced on the first wiring line is determined by measuring a voltage that is produced at either a part or all of the resistors for producing the reference voltage.

Preferably, the counter electromotive force judging unit changes the threshold voltage in response to a voltage value of the DC power supply.

Preferably, the counter electromotive force judging unit includes a resistor for producing a reference voltage and a capacitor for producing the reference voltage. One terminal of the resistor is connected to a junction point between the semiconductor switch and the first wiring line. The capacitor is connected to the other terminal of the resistor. The control unit includes a comparing unit that compares a voltage produced at the one terminal of the resistor with a voltage obtained by dividing a voltage produced at the other terminal of the resistor. An occurrence of the counter electromotive force is detected based on a comparison result of the comparing unit.

Preferably, the control apparatus further comprises a switch unit that is provided between a control input terminal of the semiconductor switch and the ground. When the counter electromotive force judging unit determines that the counter electromotive force exceeds the threshold voltage, the switch unit is turned ON to connect the control input terminal of the semiconductor switch to the ground, thereby the semiconductor switch is turned OFF.

Preferably, one terminal of the first wiring line is connected to the DC power supply. The other terminal of the first wiring line is connected to a plurality of the semiconductor switches. When the counter electromotive force judging unit determines that the counter electromotive force exceeds the threshold voltage, all of the semiconductor switches are turned OFF, and thereafter, the semiconductor switches are sequentially turned ON in a predetermined time interval.

Preferably, the DC power supply is a battery mounted on a vehicle. The load is an electric appliance mounted on the vehicle.

In accordance with the control apparatus of the semiconductor switch of the present invention, in such a switching circuit that the semiconductor switch is arranged on a high side of a load, when a wiring line for connecting the semiconductor switch to the load is shortcircuited to be grounded, and thus, an excessively large shortcircuit current flows, a judgement is made as to whether or not a magnitude of counter electromotive force E1 generated on a first wiring line for connecting a plus terminal of a power supply to the semiconductor switch exceeds a predetermined value. As a result, the shortcircuit current can be detected within a minimum time just after the shortcircuit current is produced. Thus, a cutoff operation of the shortcircuit current can be urged, so that a power loss which is produced in the semiconductor switch by the shortcircuit current can be suppressed to a minimum power loss.

As a result, when a semiconductor element which is employed as a switch is selected, limitations caused by a withstanding characteristic with respect to the shortcircuit current may be relaxed. Therefore, semiconductor elements having relatively small capacities may also be employed, which may reduce production cost.

Also, a rush current of a lamp load, or the like, may also cause an occurring factor as to the counter electromotive force E1. However, since the wiring line between the semiconductor switch and the load is grounded, such a nature is utilized that an increasing gradient of the shortcircuit current becomes necessarily larger than an increasing gradient of the rush current. Furthermore, such a value which exceeds the counter electromotive force E1 (E1 rush) which is produced by the rush current is employed as a judging value. As a consequence, the rush current can be firmly discriminated from the shortcircuit current Also, this current discrimination can be carried out just after the shortcircuit current happens to occur without waiting for the increase of the current.

Furthermore, since an increased gradient of a current which exceeds a rush current is present only in a shortcircuit current, and also, a current increase phenomenon occurred at this time is accompanied with an abrupt large energy change, there is a small possibility as to an erroneous judgement in the judging method employed by the present invention, and therefore, this judging method may have superior reliability.

Also, the higher the power supply voltage is increased, the larger the destroying energy becomes which is given to the semiconductor element by the shortcircuit current. In the case that a battery of a vehicle is exemplified, a shortcircuit current produced in a 42 V battery series may cause more serious problem, as compared with that of a 12 V battery series. However, in accordance with the present invention, an increase of a current when a shortcircuit current is produced, and a duration time of the increased current can be theoretically minimized, as compared with those of the related method. As a result, even in a high voltage battery series such as a 42 V battery series, the control apparatus of the semiconductor element may be employed as a unit capable of protecting a semiconductor element from a shortcircuit current, which is employed on a high potential side of a load.

A rapid increase of such a current which exceeds a rush current does not occur except for a shortcircuit/grounding failure. Also, since such a rapid current increase corresponds to a phenomenon combined with a large energy charge, this phenomenon can be firmly discriminated from noise. In other words, such a phenomenon that a current flowing through the first wiring line is rapidly increased never occurs due to the noise. As a consequence, there is no possibility as to an erroneous judgement under such a condition that if a rapid increase of such a current exceeding a rush current can be detected, then an occurrence of a shortcircuit/grounding failure is judged. In other words, since an S/N ratio of such events which are used in the failure judgement is large, the shortcircuit/grounding failure can be firmly judged although the time require for the failure judgement is short.

Also, since the threshold voltage which is used when the shortcircuit current is judged is interlined with respect to the voltage value of the DC power supply, the optimum threshold voltage can be continuously set even in such a case that this voltage value of the DC power supply is largely varied depending upon conditions, for example, a DC voltage value of a battery mounted on a vehicle. As a result, the shortcircuit current can be detected in high precision Moreover, in such a circuit that plural sets of channels are provided and each of these channels is constituted by a semiconductor switch and a load coupled to this semiconductor switch, in such a case that excessively high counter electromotive force E1 which exceeds the threshold voltage is generated in the first wiring line which is commonly provided with respect to these plural channels, all of these plural channels are once cut off. Thereafter, the semiconductor switches contained in the respective channels are sequentially turned ON.

As a consequence, in such a channel that a shortcircuit/grounding event has, occurred, excessively large counter electromotive force may be produced at a time instant when the semiconductor switch of this channel is turned ON. As a result, this semiconductor switch is cut off, where the semiconductor switches employed in other normal channels are turned ON. Accordingly, in the case that a plurality of channels are provided, when a shortcircuit/grounding event happens to occur in any of these plural channels, this channel of the shortcircuit/grounding event can be immediately specified, and also, only this channel can be stopped.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
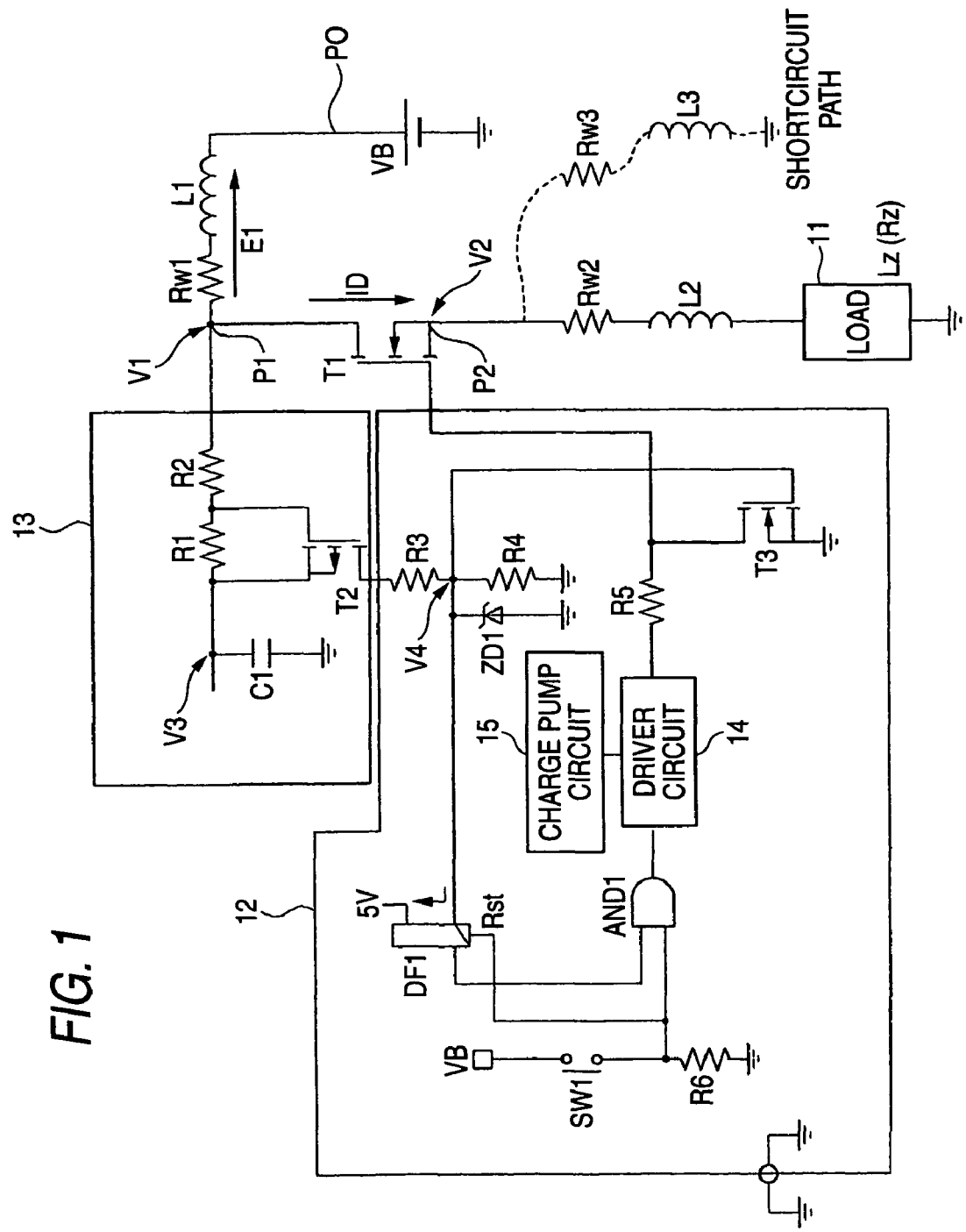
FIG. 1 is a circuit diagram for indicating an arrangement of a control apparatus of a semiconductor switch according to a first embodiment of the present invention.

Referring now to drawings, various embodiments of the present invention will be described. FIG. 1 is a circuit diagram for indicating an arrangement of a load driving circuit including a control apparatus of a semiconductor switch, according to a first embodiment of the present invention. In this first embodiment, as one example of the load driving circuit, a description is made of such a circuit which drives a load (electric appliance), for instance, a power window driving motor and a headlight by using a battery (DC power supply) which is mounted on a vehicle.

As shown in FIG. 1, this load driving circuit includes a load 11 having both an internal resistance Rz and an internal inductance Lz, a DC power supply VB, and an N type MOSFET T1 serving as a semiconductor switch. The N type MOSFET T1 is interposed between the load 11 and the DC power supply VB to turn ON/OFF the load 11.

Then, a wiring line connected to a plus terminal (point P0) of the power supply VB and a drain (pint P1) of the N type MOSFET T1 is defined as a first wiring line. A resistance of the first wiring line is Rw1, and an inductance of the first wiring line is L1. Also, a wiring line connected to the load 11 and a source (point P2) of the N type MOSFET T1 is defined as a second wiring line. A resistance of the second wiring line is Rw2, and an inductance of the second wiring line is L2. Then, the other terminal of the load 11 is connected to a minus terminal (ground) of the power supply VB.

In the above description, the N type MOSFET is exemplified as the semiconductor switch. Alternatively, if any of switching elements such as a PMOS, an IGBT, a PNP transistor, and an NPN transistor may be used on the high potential side of the load, then those semiconductor elements may be used.

Also, this load driving circuit includes a control circuit (a control unit) 12, and a counter electromotive force detecting circuit (a counter electromotive force judging unit) 13. The control circuit 12 controls turning ON/OFF operations of the MOSFET T1. The counter electromotive force detecting circuit 13 detects counter electromotive force "E1" which is generated in the first wiring line when a shortcircuit failure happens to occur between the MOSFET T1 and the load 11.

The control circuit 12 includes a switch SW1, a resistor R6, an AND circuit AND1, a driver circuit 14, a resistor R5 and a charge pump 15. The switch SW1 is connected to the power supply VB, and is turned ON/OFF by a user. The resistor R6 is disposed between the switch SW1 and the ground. The driver circuit 14 outputs a drive signal to the gate of the MOSFET T1 when an output signal of the AND circuit AND1 becomes an H level. The resistor R5 is connected to the output side of the driver circuit 14. The charge pump 15 supplies electric power to the driver circuit 14.

Furthermore, a junction point between the resistor R5 and the gate of the MOSFET T1 is connected to a drain of an MOSFET T3 (a switch unit). A source of the MOSFET T3 is grounded, and the gate of which is connected to an input terminal of a latch DF1. Then, both an output terminal of the latch DF1, and a junction point between the switch SW1 and the resistor R6 are connected to two input terminals of the AND circuit AND1. Also, a junction point between the switch SW1 and the resistor R6 is also connected to a reset terminal of the latch DF1.

Furthermore, the gate of the MOSFET T3 is grounded via the resistor R4, and also, is grounded via a zener diode ZD1, and moreover, is connected via the resistor R3 to the counter electromotive force detecting circuit 13.

In the counter electromotive force detecting circuit 13, a series circuit is arranged at the drain of the MOSFET T1, namely between the point P1 and the ground. The series circuit is constituted by resistors R1 and R2 (resistors for producing reference voltage), and a capacitor C1 (capacitor for producing reference voltage). In addition, the counter electromotive force detecting circuit 13 includes a MOSFET T2. A source and a gate of the MOSFET T2 are connected to both terminals of the resistor R1 respectively, and a drain of the MOSFET T2 is connected to one terminal of the resistor R3.

Next, a description is made of operations as to the control apparatus of the semiconductor switch according to the first embodiment. In the control apparatus of the semiconductor switch according to the first embodiment, the ON/OFF operations of the MOSFET T1 are switched so as to turn ON/OFF the load 11 by operating the switch SW1. Also, in the case that a shortcircuit failure happens to occur, since the MOSFET T1 is rapidly turned OFF, both the circuit and the own MOSFET T1 can be protected. Then, in this first embodiment, the control apparatus of the semiconductor switch judges as to whether or not a shortcircuit current flows by measuring the counter electromotive force E1 generated in the first wiring line, namely between the point P1 and the point P0.

However, in an actual case, when the MOSFET T1 is turned ON, a rush current which is produced in a transition state is present. Therefore, the rush current must be discriminated from the shortcircuit current. Next, a description is made how such a counter electromotive force "E1" generated in the first wiring line based upon the rush current is different from the counter electromotive force "E1" generated in the first wiring line based upon the shortcircuit current.

Figure 2:
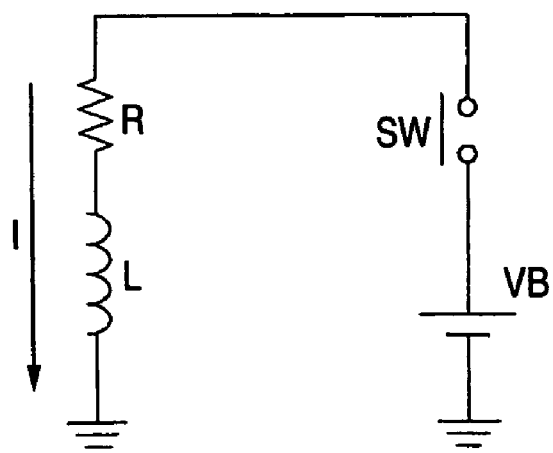
FIG. 2 is a circuit diagram for explaining a change in transition currents.
Figure 3:
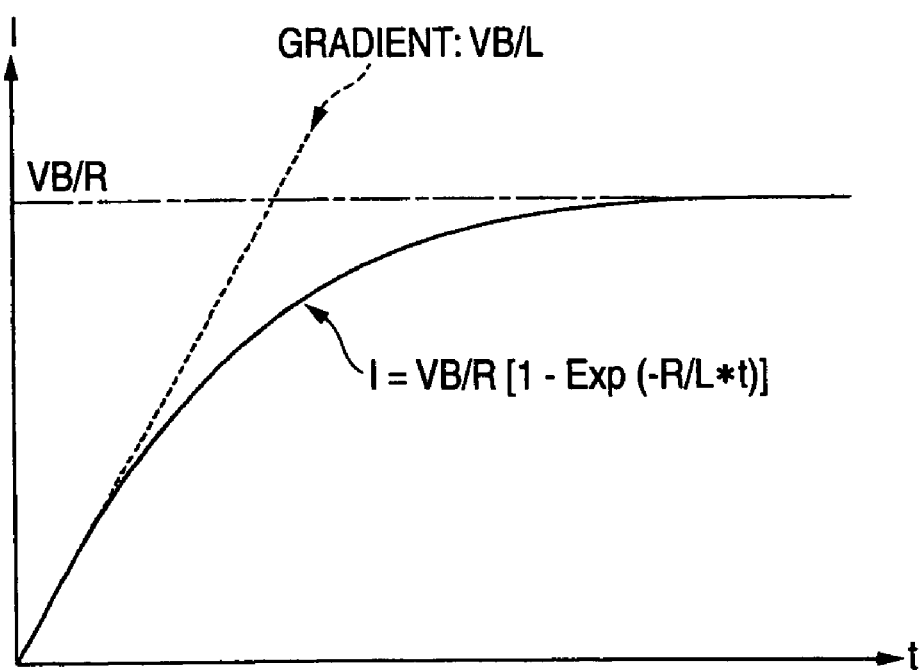
FIG. 3 is a characteristic diagram for showing the change in the transition currents which are generated in the circuit shown in FIG. 2.

Before a concrete circuit is explained, while a simple circuit shown in FIG. 2 is employed, such a current "I", flowing through the simple circuit when a switch SW is turned ON, is calculated. This simple circuit is constituted by an inductance "L", a resistance "R", a power supply "VB", and the switch SW.

In the simple circuit shown in FIG. 2, when the switch SW is turned ON at a time instant t=0, the current "I" which flows through this circuit may be expressed by the below-mentioned equation (3).

$$L*dI/dt+R*I=VB \quad (3)$$

When the above-explained equation (3) is solved, the below-mentioned equation (4) is obtained.

$$I=VB/R\{1-\text{Exp}(-R/L*t)\} \quad (4)$$

In other words, the current I is increased based upon a time constant L/R and is directed to a reaching target current value of "VB/R."

Subsequently, if both right/left sides of the equation (4) are differentiated, then the below-mentioned equation (5) is obtained.

$$dI/dt=VB/R*R/L*\text{Exp}(-R/L*t)=VB/L*\text{Exp}(-R/L*t) \quad (5)$$

As can be understood from the equation (5), a current gradient "dI/dt" becomes maximum at t=0. At this time, the current gradient dI/dt may be calculated by the below-mentioned equation (6), assuming now that t=0.

$$dI/dt(@t=0)=VB/L \quad (6)$$

As a consequence, the gradient of the current I at t=0 may be determined only the magnitudes of the voltage VB and the inductance L, and has no relationship with the resistance R. At this time, counter electromotive force which is generated both the terminals of the inductance L is given as follows:

$$L*dI/dt(@t=0)=L*VB/L=VB.$$

In other words, when t=0, the counter electromotive force generated across both the terminals of the inductance L becomes maximum, and this maximum counter electromotive force is equal to the power supply voltage VB in the magnitude.

The above-described content is applied to FIG. 1, namely the circuit diagram of the present invention. It is so assumed that the inductance of the load 11 is Lz and the resistance thereof is Rz, whereas an inductance of a circuit between the point P2 and the ground (GND), which contains a shortcircuit path, is "L3", and a resistance of this circuit is "Rw3." The non-grounded side of the shortcircuit path is present at any position on the second wiring line which connects the point P2 to the load 11. It is also assumed that either a rush current or a shortcircuit current starts at t=0. A current gradient when the rush current starts becomes VB/(L1+L2+Lz), and assuming that the counter electromotive force E1 is equal to "E1rush" at this time, this counter electromotive force "E1rush" is given by the following equation (7).

$$E1\text{ rush} = L1*VB/(L1+L2+Lz) \quad (7)$$
$$= VB*L1/(L1+L2+Lz)$$

On the other hand, a current gradient when the shortcircuit current starts becomes VB/(L1+L3), and assuming that the counter electromotive force E1 is equal to "E1short" at this time, this counter electromotive force "E1short" may be calculated by the below-mentioned equation (8).

$$E1\text{ short} = L1*VB/(L1+L3) \quad (8)$$
$$= VB*L1/(L1+L3)$$

When the rightmost sides of the above-explained equations (7) and (8) are compared with each other, the numerators thereof are identical to each other, but the denominators thereof are different from each other. Further, the denominator of the equation (8) is smaller than the denominator of the equation (7). This reason is given as follows. That is, since the denominator of the equation (8) has no "Lz", and also, the shortcircuit path is formed in such a manner that a certain point existed on the second wiring line is shortcircuited/grounded on a vehicle body (ground level) in the normal case the inductance relationship becomes L2≧L3.

As a consequence, the relationship between both the counter electromotive force is given as "E1short>E1rush." Also, since the inductances L1, L2, Lz are such constants which are determined based upon the load 11 and the wiring line structure, the counter electromotive force E1 rush is changed in response to the voltage VB. Then, this counter electromotive force E1 rush can be clearly specified as a value (voltage). As a consequence, if the shortcircuit judging value is set to such a voltage level which is higher than the counter electromotive force E1 rush corresponding to an upper limit voltage (normally, 16 V as upper limit of 12±4 V) of a use voltage range, then it is possible to judge that when the counter electromotive force E1 exceeds this shortcircuit judging value, a shortcircuit current happens to occur. In other words, this judging method never conducts erroneous operations which are caused by voltage variations. The closer the shortcircuit grounding point is approached to the point P2 on the second wiring line, the larger the adverse influence caused by the shortcircuit/grounding event is increased, and thus, the shortcircuit current is increased. At the same time, the counter electromotive force E1 short is increased, so that the detection of this counter electromotive force E1 short can be more firmly detected.

Furthermore, if the shortcircuit judging value is set to be direct proportion to the power supply voltage VB, then this shortcircuit judging value can be set to be a smaller judging value. This value setting condition will be explained in a second embodiment later.

Next, a description is made of a method for detecting the counter electromotive force E1 short in the circuit shown in FIG. 1. Since such a circuit, in which the resistors R1 and R2 are series-connected to the capacitor C1, is arranged between the point P1 and the ground as the counter electromotive circuit 13, while the load 11 is operated under the normal condition, a voltage V3 at the non-grounded terminal of the capacitor C1 is charged up to the voltage V1 of the point P1. Since a voltage drop caused by that the load current ID flows through the first wiring line is small under the normal condition, the non-grounded terminal voltage V3 is nearly equal to the power supply voltage VB.

This voltage V3 at the non-grounded terminal of the capacitor C1 may constitute a reference voltage when the magnitude of the counter electromotive force E1 is measured. In accordance with this first embodiment, when the counter electromotive force E1 is generated and thus the voltage V1 at the point P1 is lowered, it is so judged as to whether or not a shortcircuit current flows by measuring a difference voltage between this voltage V1 and the reference voltage V3.

In other words, in such a case that the difference voltage (V3−V1) exceeds a preset threshold voltage, such a judgment is made that the short current flows in the circuit. Then, this difference voltage (V3−V1) constitutes a voltage appeared at both the terminals of the resistors R1 and R2. In this first embodiment, such a voltage across both the terminals of the resistor R1 is measured as a voltage which is partially produced in the first-mentioned voltage, so that an occurrence of such a shortcircuit current is judged.

Also, a value of a time constant "C1*(R1+R2)" is set in such a manner that until the judgment is made of the shortcircuit current, even when the voltage V1 of the point P1 is lowered, the reference voltage V3 is not lowered. Then, the source of the P type MOSFET T2 is connected to the non-grounded terminal of the capacitor C1, and the gate thereof is connected to a coupling point between the resistors R1 and R2. Assuming now that the threshold voltage of the MOSFET T2 is equal to "Vth2", the resistance values of the resistors R1 and R2 are selected in such a manner that the below-mentioned equation (9) can be satisfied.

$$E1rush < Vth2*(R1+R2)/R1 \quad (9)$$

The circuit in which the resistors R3 and R4 are series-connected to each other has been arranged between the drain of the MOSFET T2 and the ground GND, so that a voltage V4 at the coupling point between the resistors R3 and R4 is input to the latch DF1. The zener diode ZD1 is arranged in order that this voltage V4 does not exceed the power supply voltage of 5V of the logic circuit. It should be understood that the zener voltage of the zener diode ZD1 is selected to be lower than, or equal to 5 V.

The latch DF1 is reset when the switch SW1 is under OFF state, and the output signal of the latch DF1 becomes an H level. Then, when the input signal (=voltage V4) is raised from an L level to an H level, the latch DF1 latches the output (=one input of AND1) at an L level.

Since one end of the switch SW1 is connected to the power supply VB so as to be grounded via the resistor R6, when the switch SW1 is turned ON, the output signal of the AND circuit AND1 becomes an H level, so that the driver circuit 14 applies the voltage of the charge pump 15 to the gate of the MOSFET T1 so as to turn ON the MOSFET T1.

As a result, since the DC voltage VB is applied to the load 11, this load 11 may be driven. Also, when the switch SW1 is turned OFF, the output signal of the AND circuit AND1 becomes an L level, so that the MOSFET T1 is turned OFF so as to cut off the supply of the voltage to the load 11.

Next, a description is made of operations in the case that when a shortcircuit current happens to occur, the circuit is cut off. When the switch SW1 is turned OFF, the voltage V3 at the non-grounded terminal of the capacitor C1 is charged up to the power supply voltage VB, and the MOSFET T2 is turned OFF, since there is no potential difference between the source and the gate of the MOSFET T2.

On the other hand, the output signal of the latch DF1 is set to the H level. When the switch SW1 is turned ON, the MOSFET T1 is turned ON. As a result, a load current ID flows through the circuit which is connected to the load 11. Also, a rush current may flow for a time period during which a transition condition just after the MOSFET T1 is turned ON. More specifically, a large rush current may flow in the case that the load 11 corresponds to either lamp load or a motor load.

Figure 4:
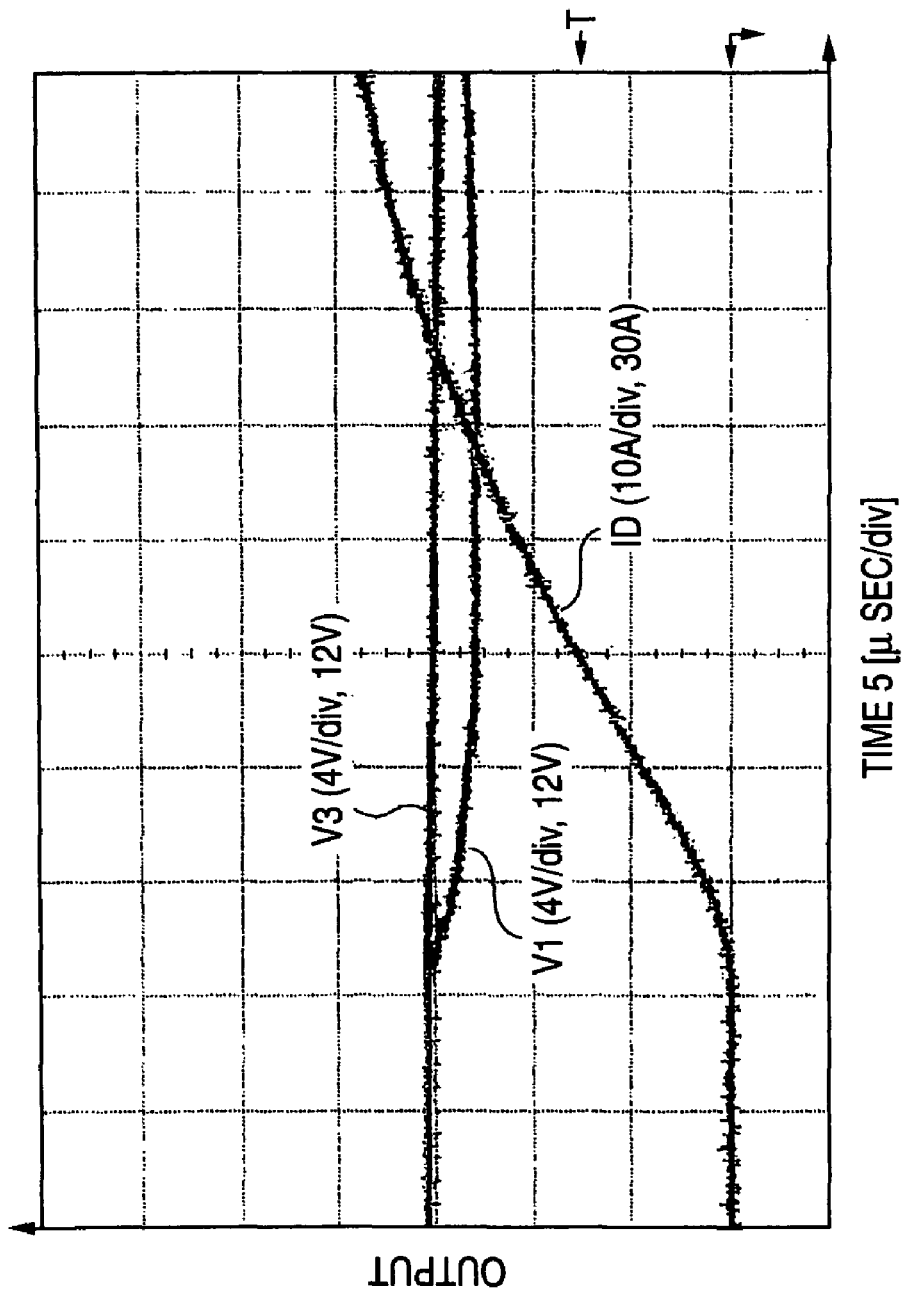
FIG. 4 is a characteristic diagram for represents changes in voltages V1, V3, and changes in currents ID when a transition current flows.

Then, the counter electromotive force E1 is produced in the first wiring line (namely, from point "P0" to point "P1") along a direction indicated by an arrow of FIG. 1 (namely, directed form left side to right side in FIG. 1 ).due to the above-explained rush current. FIG. 4 graphically represents waveforms as to the rush current ID, the reference voltage V3, and the voltage V1 of the point P1 when the power supply voltage is selected to be 12.5 V, and the load 11 is constituted as a lamp load made of 21 W×3 lamps.

Scales of FIG. 4 are defined as ID (10 A/div, 30 A), V3 (4 V/div, 12V), and V1 (4 V/div, 12V). The representation (10 A/div, 30 A) of the scale implies that one scale of an ordinate corresponds to 10 A, and a horizontal line at a center position along upper/lower directions corresponds to 30 A.

A scale of an abscissa corresponds to 5 μsec/div. The counter electromotive force E1 is generated due to the rush current, and the voltage V1 at the point P1 becomes lower voltage than the power supply voltage VB. On the other hand, since the discharge is suppressed by the resistors R1 and R2, the non-rounded voltage of the capacitor C1 cannot follow lowering of the voltage V1, and therefore, is not substantially changed.

From the waveforms shown in FIG. 4, the following fact can be read That is, the counter electromotive force E1=V3−V1 becomes maximum after time of 12 μsec has elapsed from a rising edge of the rush current, and this maximum voltage becomes 1.8 V. Since the resistors R1, R2, and the threshold voltage Vth2 of the MOSFET T2 are set with respect to the counter electromotive force E1 (=E1rush), the MOSFET T2 is not turned ON.

As a consequence, the rush current ID will rise while the MOSFET TA is not cut off. A gradient of the rush current corresponds to 1.25 A/μsec in maximum, and a current peak is reached to 45 A.

Figure 5:
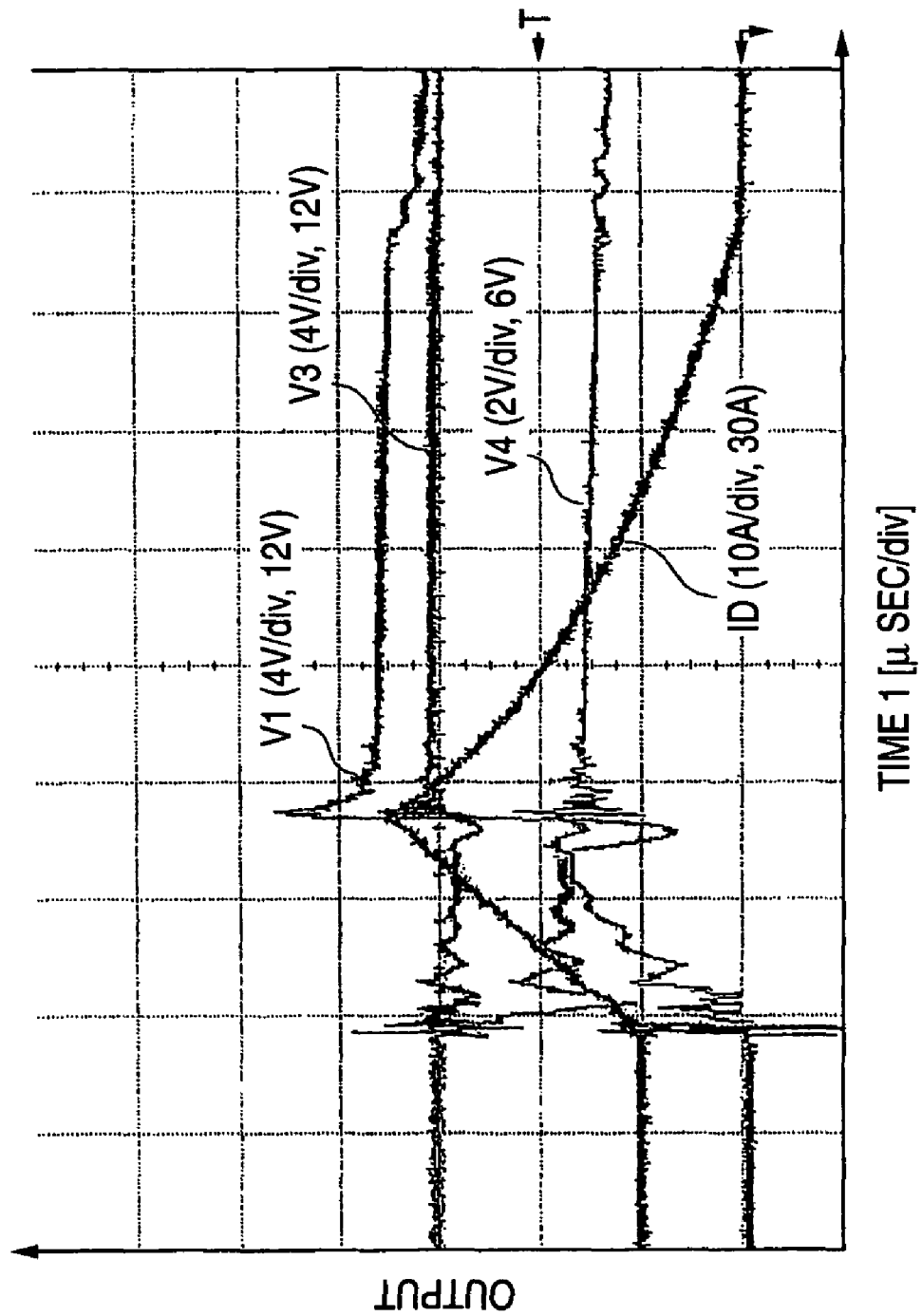
FIG. 5 is a characteristic diagram for represents changes in voltages V1, V3, and changes in currents ID when a shortcircuit current flows.

Next, waveforms when a shortcircuit/grounding event (failure) occurs in the second wiring line (from point P2 to load) are shown in FIG. 5. The shortcircuit current ID flows through the shortcircuit path, and the counter electromotive force E1 becomes E1 short shown in the above-described equation (8). Scales of the shortcircuit current ID are (5 A/div, 15 A) in an ordinate and 1 μsec/div in an abscissa, which are different from those of FIG. 4. A gradient of the shortcircuit ID which may be read from the waveform is equal to 7 A/μsec. Thus, this gradient of the shortcircuit ID becomes larger than that of the rush current by 5.6 times. As a result, the lowering amount of the voltage V1 at the point P1 becomes large, as compared with that of the rush current. Also, the counter electromotive force E1=V3−V1 becomes maximum at a time instant of 0.2 μsec after the shortcircuit/grounding event happens to occur, and the maximum value thereof is 6 V to 7 V.

An average value of the counter electromotive force E1 is reached to 4 V. When the waveform of the counter electromotive force E1 generated by the shortcircuit current is compared with the waveform of the counter electromotive force E1 generated by the rush current, the time reached to the maximum value in the shortcircuit current becomes 0.2 μsec with respect to 12 μsec of the rush current, namely has been largely shortened. Also, the maximum value of the counter electromotive force E1 generated by the shortcircuit current becomes 6 V to 7 V with respect to 1.8 V of the rush current, namely is larger than that of the rush current by 3, or more times. As a consequence, V3−V1 exceeds the judging voltage Vth2*(R1+R2)/R1, so that the MOSFET T2 is turned ON. As a result, the voltage V4 at the coupling point between the resistors R3 and R4 is increased, and then the MOSFET T3 is turned ON at a time instance of approximately 1.5 μsec after the shortcircuit/grounding event happens to occur Turning ON of the MOSFET T3 can be judged based upon the rapid drop of the voltage V1.

Then, since the MOSFET T3 is turned ON, the electric charges stored in the gate of the MOSFET T1 are rapidly discharged, and thus, the MOSFET T1 is turned OFF. At a time instant of 1.8 μsec, a peak value of the shortcircuit current ID is represented.

A time period after the MOSFET T1 is turned OFF until the shortcircuit current ID is reached to the peak current is approximately 0.3 μsec, namely becomes short. Although the shortcircuit current ID is rapidly cut off, the voltage V1 at such a time when the shortcircuit current ID is reached to the peak value is equal to 18 V, namely does not become so high. This reason is given as follows That is, since the shortcircuit current ID at the time of cutting the MOSFET T1 is on the order of 15 A to 17 A, namely is small, electromagnetic energy "½*(L1+L3)*ID$^2$" stored in the circuit through which the shortcircuit current ID flows is small.

Since "V3−V1" is reached to 6 to 7 V just after the shortcircuit failure happens to occur (after 0.2 μsec), the judgment as to the shortcircuit current is accomplished at this time. In other words, this condition may be understood that the time duration after the shortcircuit failure is occurred until the shortcircuit current is judged becomes a minimum time. In this first embodiment, the cutting-off operation of the MOSFET T1 is delayed due to the response delay of the circuit. However, if the response of the circuit can be more shortened, then the peak value of the shortcircuit current ID may become smaller, so that a power loss produced in the MOSFET T1 when this MOSFET T1 is cut off may be furthermore reduced.

On the other hand, since the voltage V4 rises, the output level of the latch DF1 is changed into an L level, and the output level of the AND circuit AND1 becomes an L level, and the output terminal of the driver circuit 14 is grounded, so that the OFF state of the MOSFET T1 is maintained.

It should be understood that only when the output terminal of the driver circuit 14 is merely grounded without employing the MOSFET T3, the MOSFET T1 may be cut off. In this first embodiment, since the output terminal of the driver circuit 14 is grounded with employment of the MOSFET T3, the MOSFET T1 can be more quickly cut off.

As previously explained, in the control apparatus of the semiconductor switch according to this first embodiment, the counter electromotive force E1 which is produced in the first wiring line for connecting the DC power supply VB to the MOSFET T1 is detected. Then, in such a case that this detected counter electromotive force E1 is larger than a preset threshold value, namely, in the case that the voltage produced between both the terminals of the resistor R1 of the counter electromotive force detecting circuit 12 is higher than the threshold voltage Vth2 of the MOSFET T2, the MOSFET T3 functioning as the switch unit is turned ON, thereby the MOSFET T1 is cut off.

As a consequence, when the shortcircuit/grounding event happens to occur, the circuit can be immediately cut off, and therefore, the temperature increase of the MOSFET T1 can be prevented. As a result, the restriction caused by the withstanding characteristic with respect to the shortcircuit current can be relaxed, and also, such a semiconductor element having a small capacity may be used, so that the space saving effect can be achieved, and the cost-down effect can be achieved.

Also, as indicated in the above-described equation (9), the resistance values of the resistors R1 and R2 are set in such a manner that the voltage generated in the resistor R1 does not exceed the threshold voltage Vth2 of the MOSFET T2 as to the counter electromotive force E1 rush which is produced by the rush current. As a result, the erroneous cutting-off operation caused by the rush current can be avoided.

Furthermore, the counter electromotive force E1 is calculated based upon (V3−V1) in such a manner that since the time constant circuit arranged by connecting the capacitor C1 to the resistors R1 and R2 in a series manner is employed, the voltage V3 appeared at the junction point between the capacitor C1 and the resistor R1 does not follow the rapid change of the voltage V1 at the point P1. As a result, the counter electromotive force E1 can be detected in the simple and firm method.

In addition, since the time constant during the charging operation is made identical to the time constant during the discharging operation in the time constant circuit arranged by connecting the capacitor C1 to the resistors R1 and R2 in the series manner, the counter electromotive force E1 can be detected in the high precision.

The magnitude of the counter electromotive force within the counter electromotive force E1 produced between both the terminals of the resistors R1 and R2 (resistors for producing reference voltage) is judged based upon the magnitude of such a voltage produced between both the terminals of the resistor R1. Since the ratio of the resistance values as to the resistors R1 and R2 is arbitrarily set, the desirable threshold voltage can be set.

Moreover, in the case that the magnitude of the counter electromotive force E1 exceeds the threshold voltage, so that the MOSFET T2 is turned ON, the MOSFET T3 functioning as the switch unit is turned ON, thereby the gate of the MOSFET T1 is immediately connected to the ground so as to turn OFF the MOSFET T1. As a consequence, when the shortcircuit/grounding event happens to occur, the MOSFET T1 is very fastly turned OFF, so that the circuit can be protected.

Next, a description is made of a control apparatus of a semiconductor switch, according to a second embodiment of the present invention. As previously explained, the judging value of the counter electromotive force E1 must be set to such a larger value than the counter electromotive force which is produced in the first wiring line (wiring line between point P0 and point p1 shown in FIG. 1) by the rush current corresponding to the normal current. On the other hand, in order to improve the detection sensitivity, it is desirable that this judging value is set to a small value as being permitted as possible.

However, when a battery of a vehicle is exemplified as an example, there are some cases that a voltage value output from the power supply voltage VB is varied. As a consequence, a judging value for the counter electromotive force E1 must be set by assuming that the power supply voltage VB is maximum. In this case, if the power supply voltage VB becomes a low voltage value, then a judging value is necessarily set to such a high value having no meaning, which may lower the efficiency.

Under such a circumstance, in accordance with the second embodiment, such a control function is additionally provided with respect to the control apparatus of the semiconductor switch according to the first embodiment. That is, in this control function, since the judging value of the counter electromotive force E1 is changed in accordance with the magnitude of the power supply voltage VB, this judging value can be continuously set to a suitable judging value. As a result of this control function, a gap between the counter electromotive power E1 caused by the rush current and the judging value can be reduced, so that a useless operation when the judging value is set to be constant can be avoided, and the protection performance can be improved. A concrete content of the second embodiment will now be explained.

Figure 6:
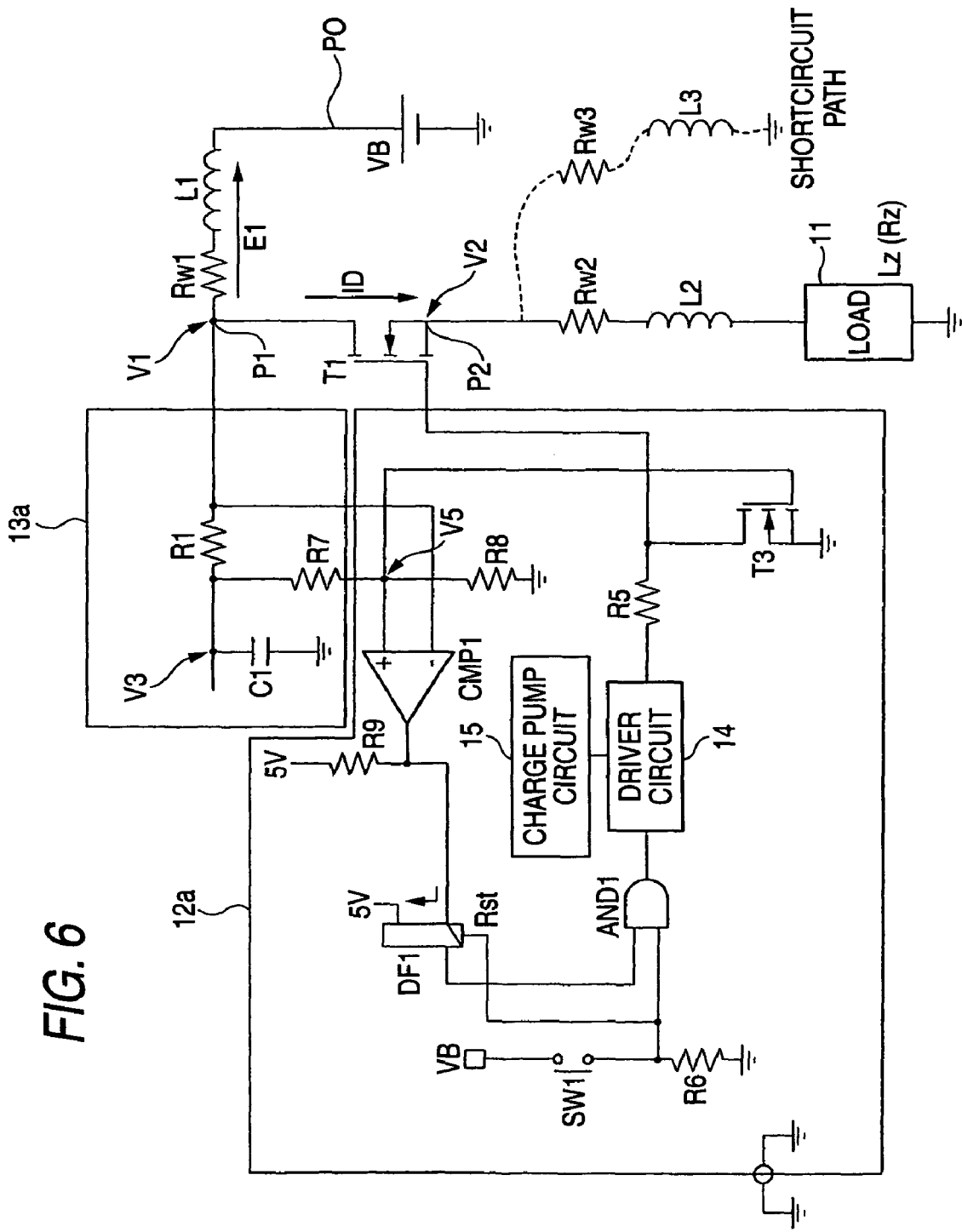
FIG. 6 is a circuit diagram for indicating an arrangement of a control apparatus of a semiconductor switch according to a second embodiment of the present invention.

FIG. 6 is a circuit diagram for indicating an arrangement of a control apparatus of a semiconductor switch, according to the second embodiment. Now, if only different points from those of FIG. 1 are described, the control circuit 12 of the first embodiment shown in FIG. 1 is replaced by another control circuit 12a in this second embodiment. This control circuit 12a includes a comparator (a comparing unit) CMP1, and resistors R8 and R9.

Also, in this second embodiment, the above-explained counter electromotive force detecting circuit 13 of FIG. 1 is replaced by a counter electromotive force detecting circuit 13a. This counter electromotive force detecting circuit 13a has resistors (namely, resistors for producing reference voltage) R1, R7, R8, and a capacitor (namely, capacitor for producing reference voltage) C1. In this case, resistance values as to the resistors R7 and R8 are set to sufficiently larger values, as compared with a resistance value of the resistor R1.

Next, operations of the circuit shown in FIG. 6 will now be explained. When E1=0 V, namely, a current flowing through the first wiring line is unchanged, the voltage "V3" is equal to the voltage "V1" and is nearly equal to the power supply voltage "VB." A voltage of the non-grounded terminal of the capacitor C1 becomes equal to the power supply voltage VB.

Also, a voltage "V5" which is produced by subdividing the voltage V3 by using the resistors R7 and R8 is applied to a non-inverting input terminal of the comparator, whereas the voltage V1 of the point P1 is input to an inverting terminal of this comparator CMP1. Then, when counter electromotive force E1 is produced and the voltage V1 is lowered, and then, this lowered voltage V1 becomes lower than the voltage V5, the output signal of the comparator CMP1 is changed from an L level to an H level, so that the latch DF1 is operated. That is to say, such a voltage "V3−V5" may become a judging voltage for the counter electromotive force E1.

Then, the below-mentioned equation (10) may be established.

$$V3 - V5 = R7/(R7+R8)*V3 \qquad (10)$$
$$= R7/(R7+R8)*VB$$

As a consequence, the judging voltage "V3−V5" is direct proportion to the power supply voltage VB. As a result, even in such a case that the power supply voltage VB is varied, since the judging voltage "V3−V5" can follow in conjunction with this voltage variation, the gap between the judging value and the counter electromotive power E1 caused by the rush current can be reduced. As a result, the counter electromotive force produced when the shortcircuit/grounding event happens to occur can be detected in higher precision, so that the circuit can be protected.

As previously explained, in the control apparatus of the semiconductor switch according to the second embodiment, since the judging value for the counter electromotive force is changed in response to the variation of the power supply voltage VB, the gap between the counter electromotive force produced by the rush current and the judging value for the counter electromotive force can be continuously kept as the small value. As a result, the occurrence of the shortcircuit/grounding event can be detected in the high precision, and both the semiconductor switch and the circuit can be firmly protected.

Next, a description is made of a control apparatus of a semiconductor switch, according to a third embodiment of the present invention. In the above-explained first and second embodiments, such an exemplification has been described. That is, one set (one channel) of the MOSFET T1 and the load 11 is provided on the first wiring line. Alternatively, there are some cases that a plurality of series connection circuit (will be referred to an "FET channel") constituted by a plurality of MOSFETs and loads are provided between the point P1 and the ground (GND) in a parallel manner.

In such an alternative case, when a plurality of FET channels are turned ON at the same time, the below-mentioned detecting operation must be carried out. That is, it is need to detect one of channels that is shortcircuited to be grounded so that counter electromotive power E1 which exceeds a predetermined value is generated.

In this third embodiment, in the case that a shortcircuit/grounding event happens to occur in any one of these plural FET channels, all of these channels are once turned OFF, and thereafter, the respective channels are sequentially and again turned ON in a constant interval so as to specify such an FET channel that the shortcircuit/grounding event occurs. This detecting operation may be carried out by a logic circuit.

Figure 7:
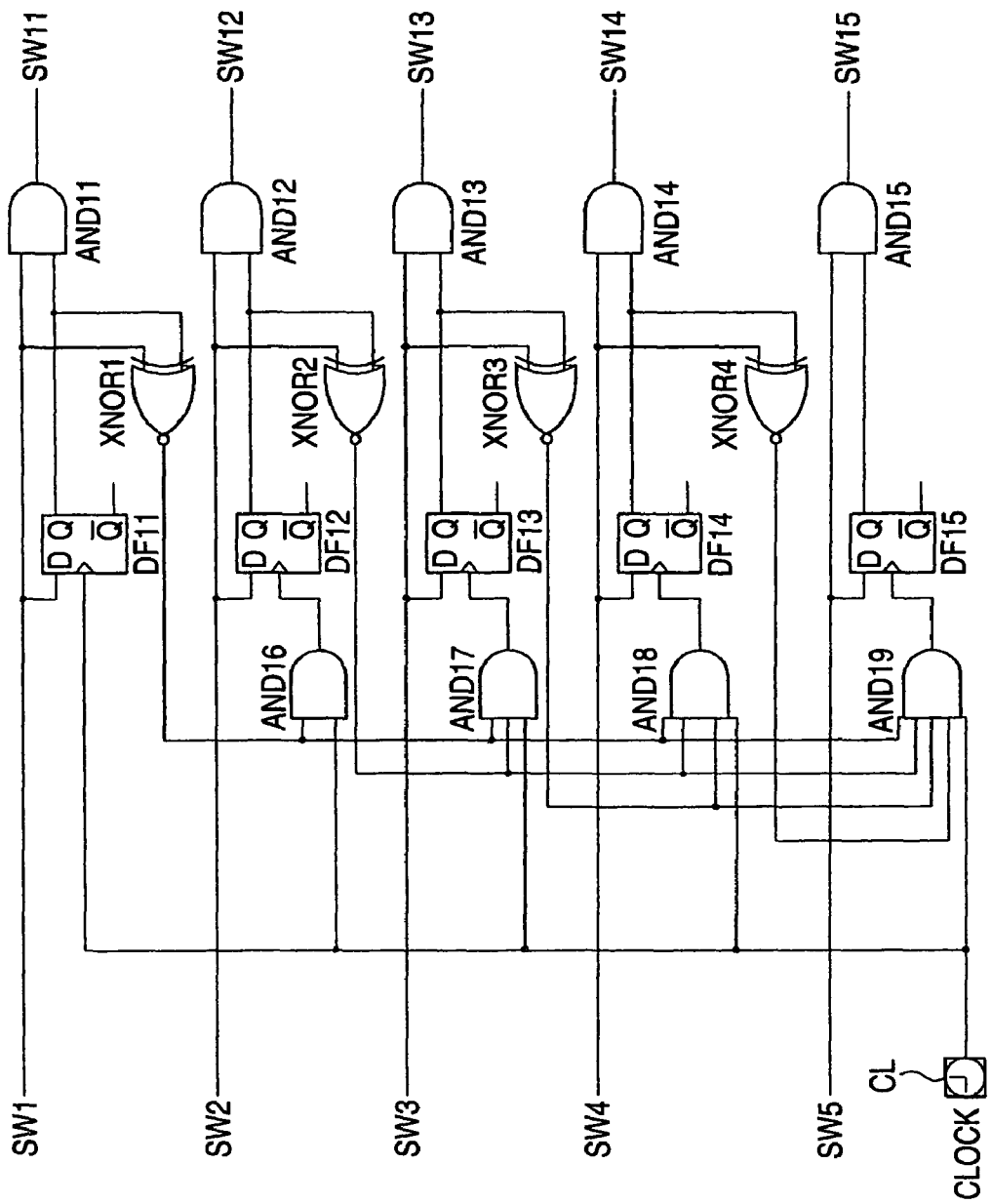
FIG. 7 is an explanatory diagram for represents a circuit for sequentially initializing a plurality of channels of a circuit after stopping once the channels.
Figure 8:
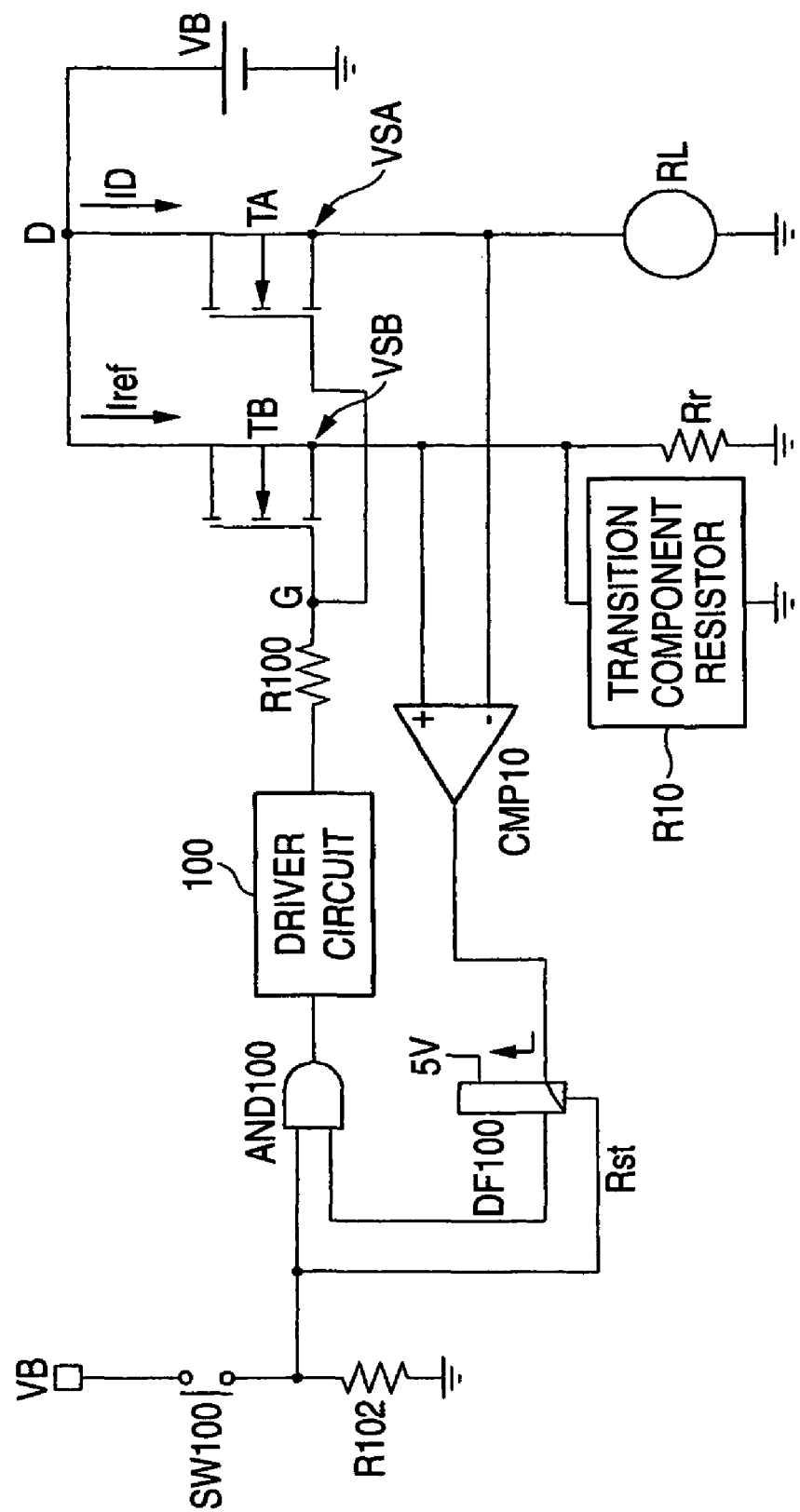
FIG. 8 is a circuit diagram for showing the arrangement of the related control apparatus for the semiconductor switch.
Figure 9:
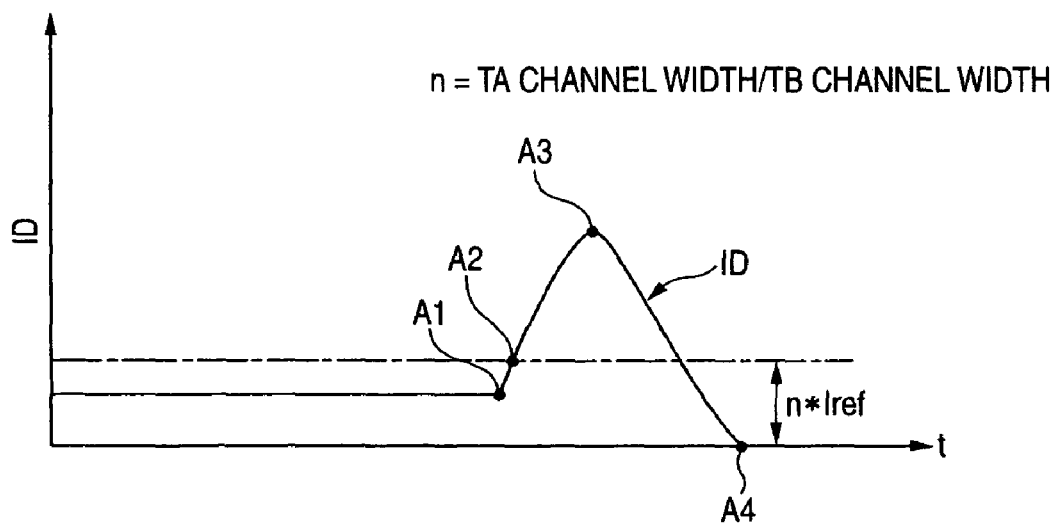
FIG. 9 is a characteristic diagram for representing the changes in the load currents ID when the shortcircuit current flows through the circuit shown in FIG. 8.
Figure 10:
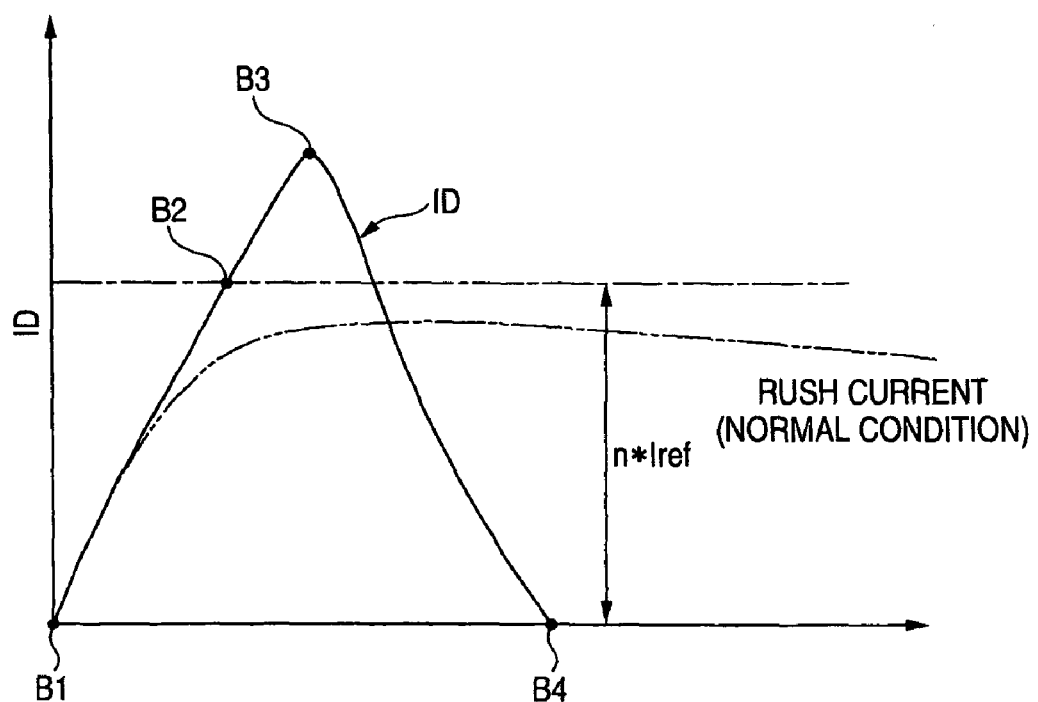
FIG. 10 is a characteristic diagram for representing the changes in the load currents ID when the shortcircuit current flows through the circuit shown in FIG. 8 during the transition time period.

FIG. 7 is a circuit diagram for indicating a sequential starting circuit for 5 channels as one example of the above-explained logic circuit. As indicated in this drawing, the sequential starting circuit includes switches SW1 to SW5, AND circuits AND11 to AND19, D type flip-flops DF11 to DF15, exclusive-NOR circuits XNOR1 to XNOR5, and also, a dock circuit CL. The switches SW1 to SW5 turn ON/OFF the MOSFETs owned by each of load circuits for 5 channels. Then, output signals SW11 to SW15 of the AND circuits AND11 to AND15 are supplied to the input terminal of the AND circuit AND1 shown in either FIG. 1 or FIG. 6.

Then, in this sequential starting circuit, assuming now that switching time (transition time period) is equal to, for example, 60 µsec, the FET channels are sequentially turned ON every 1 FET channel in a time interval of 60 µsec.

As to a normal channel, since such a counter electromotive force E1 which exceeds a predetermined value is not produced during a transition time period, turning-ON of this normal channel is continued. As to an abnormal channel where a shortcircuit/grounding event happens to occur, this abnormal channel is again cut off. When the counter electromotive force E1 is generated by turning on the abnormal channel, such a channel whose turning-ON operation has already been accomplished is not cut off among other normal channels.

Further, in such a normal channel whose starting sequence has not yet become effective, although a cutoff signal is produced due to the generation of the counter electromotive force E1, this normal channel is brought into an OFF status at this time, so that no adverse influence is given. In other words, when the counter electromotive force E1 produced by the shortcircuit/grounding event is detected, all of these FET channels are once turned OFF. Thereafter, these FET channels are sequentially turned ON every 1 channel, so that the normal channel can be discriminated from the abnormal channel.

Even when a total number of these FET channels corresponds to 10 channels, a time duration required for sequentially starting these 10 FET channels in the time interval of 60 µsec is merely 600 µsec. Practically speaking, this delay time never causes a problem in most of actual cases.

Next, operations as to the circuit shown in FIG. 7 will now be explained. When the respective input switches SW1 to SW5 of the first channel to the fifth channel are turned ON at the same time, signals of SW11 to SW15 are sequentially output in synchronism with the clock signal from the starting circuit.

It is so assumed that a time period of a clock signal output from the clock circuit CL is 60 µsec. Also, it is assumed that when the input switches SW1 to SW5 are turned OFF, the output signals thereof become "L" levels (=0), whereas when the input switches SW1 to SW5 are turned ON, the output signals thereof become "H" levels (=1). When the switches SW1 to SW5 are turned OFF, the Q outputs of the respective D type flip-flops DF11 to DF15 become 0, and the Q-bar outputs thereof become 1.

Since two inputs of the AND circuits AND11 to AND15 commonly become 0, the output signal thereof becomes 0, so that the switches SW11 to SW15 are brought to the off-signal states. Then, when all of the switches SW1 to SW5 are input at the same time, the output signals of the exclusive-NOR circuits XNOR1 to XNOR4 become 0.

When the dock signal rises, the Q output of the D type flip-flop DF11 becomes 1, to which this clock signal is directly input, and the signal SW11 corresponding to the output of the AND circuit AND 11 becomes 1, so that the first FET channel is turned ON.

On the other hand, as to the D type flip-flops DF12 to DF15 into which the clock signal will be input via the AND circuits AND16 to AND19, since these AND circuits AND16 to AND19 are closed by receiving the output signals "0" from the exclusive-NOR circuits XNOR1 to XNOR4, the clock signals are not entered to these D type flip-flops DF12 to DF15. As a result, the output signals of the D type flip-flops DF12 to DF15 remain in the 0 level, the output signals SW12 to SW15 of the AND circuits AND12 to AND15 remain in the 0 level, and thus, the second channel to the fifth channel cannot be turned ON.

Then, since the output signal of the D type flip-flop DF11 becomes 1, the output signal from the exclusive-NOR circuit NOR1 is changed from 0 to 1, and also, one input signal of the AND circuit AND16 is changed to 1. In response to a second rising edge of the clock signal, the clock signal passes through the AND circuit AND16, and causes the Q output of the D type flip-flop DF12 to be changed into 1, so that the output signal SW12 of the AND circuit AND12 becomes 1.

As a result, in response to the second rising edge of the clock signal, the second FET channel is turned ON. The third to fifth FET channels cannot be turned ON by receiving the output signals "0" of the exclusive-NOR circuits XNOR2 to XNOR4. Since the second FET channel is turned ON, the output signals of the exclusive-NOR circuit XNOR2 is changed from 0 to 1.

When the above-explained operations of the sequential starting circuit for the 5 channels are summarized, the priority orders are given to the switches in this order from the switch SW1 to the switch SW5 by way of the exclusive-NOR circuits XNOR1 to XNOR4 and the AND circuits AND16 to AND19. The channels are sequentially turned ON from such a channel having a higher priority order every time the clock signal rises.

The switch SW11 (first channel) is turned ON without any condition in synchronism with the rising edge of the dock signal, whereas the switch SW15 (fifth channel) can be turned ON in response to the clock signal only when all of the output signals from the exclusive-NOR circuits XNOR1 to XNOR4 become 1. Such a fact that the output signals of the exclusive-NOR circuits XNOR1 to XNOR4 are equal to 1 indicates that the relevant channel is not present during the transition time period from an OFF state to an ON state, or from an ON state to an OFF state. In other words, the relevant channel is set under either the ON state or the OFF state in a stable manner. If this logic circuit is employed, then even when the ON signals are simultaneously entered to two, or more channels, these plural channels can be sequentially turned ON every 1 channel.

As previously described, in accordance with the control apparatus of the semiconductor switch of this third embodiment, when the load circuits of the plural channels are present, in such a case that the counter electromotive force E1 is produced in the first wiring line (namely, wiring lines from point P0 to point P1 in FIG. 1) during the occurrence of the shortcircuit/grounding event, all of the plural channels are cut off. Thereafter, the switches SW11 to SW15 shown in FIG. 7 are sequentially turned ON. As a result, such a channel that the shortcircuit/grounding event occurs cannot be initiated, whereas the normal channel in which the shortcircuit/grounding event does not occur can be initiated.

As a consequence, even in such a case that the control apparatus owns the plural channels, such a channel that the shortcircuit/grounding event happens to occur can be firmly and quickly specified and can be cut off, whereas other normal channels can be driven in the normal operation.

While the control apparatus of the semiconductor switch of the present invention has been described with reference to the embodiments shown in the drawings, the present invention is not limited thereto. That is, the arrangements of the respective units of this control apparatus may be alternatively replaced by arbitrarily selected arrangements having similar functions.

For instance, in the above-described embodiments, the following example has been exemplified. That is, while the power supply is realized by the battery mounted on the vehicle, the load is realized by the lamp, the motor, or the like, which are mounted on the vehicle. However, the present invention is not limited only to this exemplified example, but may be applied to other circuits.

When a shortcircuit/grounding event happens to occur, the circuit is immediately cut off, so that the control apparatus of the semiconductor switch may become very useful for the protection of this semiconductor switch.

The present application is based on Japan Patent Application No. 2004-178801 filed on Jun. 16, 2005, the contents of which are incorporated herein for reference.

What is claimed is:

1. A control apparatus, comprising:
a semiconductor switch that is arranged between a DC power supply and a load to control a turning ON/OFF operation of the load;
a counter electromotive force judging unit that determines whether a counter electromotive force produced on a first wiring line is greater than a threshold voltage, the first wiring line connecting the semiconductor switch to the DC power supply; and
a control unit that controls the semiconductor switch so as to be turned OFF when the counter electromotive force judging unit determines that the counter electromotive force is greater than the threshold voltage,
wherein the counter electromotive force judging unit detects a voltage drop from the DC power supply voltage at a junction point between the semiconductor switch and the first wiring line.

2. The control apparatus as set forth in claim 1, wherein the threshold voltage is set to a voltage value that is higher than counter electromotive force produced on the first wiring line by a transition current flowing through the load.

3. The control apparatus as set forth in claim 1, wherein the counter electromotive force judging unit includes a resistor for producing a reference voltage and a capacitor for producing the reference voltage;
wherein one terminal of the resistor is connected to the junction point between the semiconductor switch and the first wiring line; and
wherein the capacitor is connected to the other terminal of the resistor;
wherein a voltage at a junction point between the resistor and the capacitor is employed as the reference voltage; and
wherein the counter electromotive force judging unit produces the threshold voltage based on the reference voltage.

4. The control apparatus as set forth in claim 3 wherein a circuit configured by the resistor and the capacitor is set so that a time constant of the circuit during charging operation is identical to a time constant of the circuit during discharging operation.

5. The control apparatus as set forth in claim 3, wherein the counter electromotive force produced on the first wiring line is determined by measuring a voltage that is produced across the resistor as the reference voltage.

6. The control apparatus as set forth in claim 1 wherein the counter electromotive force judging unit changes the threshold voltage in response to a voltage value of the DC power supply.

7. The control apparatus as set forth in claim 6, wherein the counter electromotive force judging unit includes a resistor for producing a reference voltage and a capacitor for producing the reference voltage;
wherein one terminal of the resistor is connected to the junction point between the semiconductor switch and the first wiring line;
wherein the capacitor is connected to the other terminal of the resistor;
wherein the control unit includes a comparing unit that compares a voltage produced at the one terminal of the resistor with a voltage obtained by dividing a voltage produced at the other terminal of the resistor; and
wherein an occurrence of the counter electromotive force is detected based on a comparison result of the comparing unit.

8. The control apparatus as set forth in claim 1, further comprising a switch unit that is provided between a control input terminal of the semiconductor switch and the ground;
wherein when the counter electromotive force judging unit determines that the counter electromotive force exceeds the threshold voltage, the switch unit is turned ON to connect the control input terminal of the semiconductor switch to the ground, thereby the semiconductor switch is turned OFF.

9. The control apparatus as set forth in claim 1, wherein one terminal of the first wiring line is connected to the DC power supply;
wherein the other terminal of the first wiring line is connected to a plurality of the semiconductor switches, and each of the plurality of the semiconductor switches is respectively, connected in series to a corresponding load of a plurality of loads;
wherein when the counter electromotive force judging unit determines that the counter electromotive force exceeds the threshold voltage, all of the semiconductor switches are turned OFF, and thereafter, the semiconductor switches are sequentially turned ON in a predetermined time interval.

10. The control apparatus as set forth in claim 1, wherein the DC power supply is a battery mounted on a vehicle; and
wherein the load is an electric appliance mounted on the vehicle.

* * * * *